(12) United States Patent
Ohmori et al.

(10) Patent No.: US 7,459,737 B2
(45) Date of Patent: Dec. 2, 2008

(54) LOW CURRENT MAGNETIC MEMORY

(75) Inventors: Hiroyuki Ohmori, Kanagawa (JP);
Kojiro Yagami, Ibaraki (JP)

(73) Assignee: Sony Corporation, Tokyo (JP)

( * ) Notice: Subject to any disclaimer, the term of this patent is extended or adjusted under 35 U.S.C. 154(b) by 115 days.

(21) Appl. No.: 11/048,119

(22) Filed: Feb. 1, 2005

(65) Prior Publication Data

US 2005/0213376 A1    Sep. 29, 2005

(30) Foreign Application Priority Data

Feb. 4, 2004    (JP)    ............................ P2004-028355

(51) Int. Cl.
*H01L 29/76*    (2006.01)
*H01L 29/94*    (2006.01)
*H01L 31/062*    (2006.01)
*H01L 31/113*    (2006.01)
*H01L 31/119*    (2006.01)

(52) U.S. Cl. ....................................................... 257/295
(58) Field of Classification Search .................. 257/295
See application file for complete search history.

(56) References Cited

U.S. PATENT DOCUMENTS 3,540,047 A * 11/1970 Walser et al. .................. 342/1
6,639,291 B1 * 10/2003 Sin et al. ..................... 257/427
6,744,086 B2 * 6/2004 Daughton et al. ........... 257/295
6,879,514 B2 * 4/2005 Hosomi et al. .............. 365/158

FOREIGN PATENT DOCUMENTS

JP    2003-017782    *    1/2003

* cited by examiner

*Primary Examiner*—Howard Weiss
(74) *Attorney, Agent, or Firm*—Wolf, Greenfield & Sacks, P.C.

(57) ABSTRACT

A magnetic memory 10 includes a memory layer 21 for holding information by a magnetization state of a magnetic material, wherein the memory layer 21 is composed of at least magnetic layers 16, 18 of two layers and a nonmagnetic layer 17 interposed between the magnetic layers 16, 18 of two layers, one magnetic layer 18 of the magnetic layers 16, 18 of two layers has a large product of a magnetization damping constant, a magnetization amount and magnetic anisotropy and a small product of the magnetization amount and the magnetic anisotropy as compared with those of the other magnetic layer. Also, information is recorded on the magnetic memory device 10 with application of an electric current flowing in the memory layer 21. Further, a magnetic memory includes the magnetic memory device 10 to record information with application of an electric current flowing in the recording layer 21. There are provided a magnetic memory device capable of recording information with application of a low electric current and a magnetic memory device driving method for recording and reading information on and from the magnetic memory device and a magnetic memory including the magnetic memory device.

10 Claims, 6 Drawing Sheets

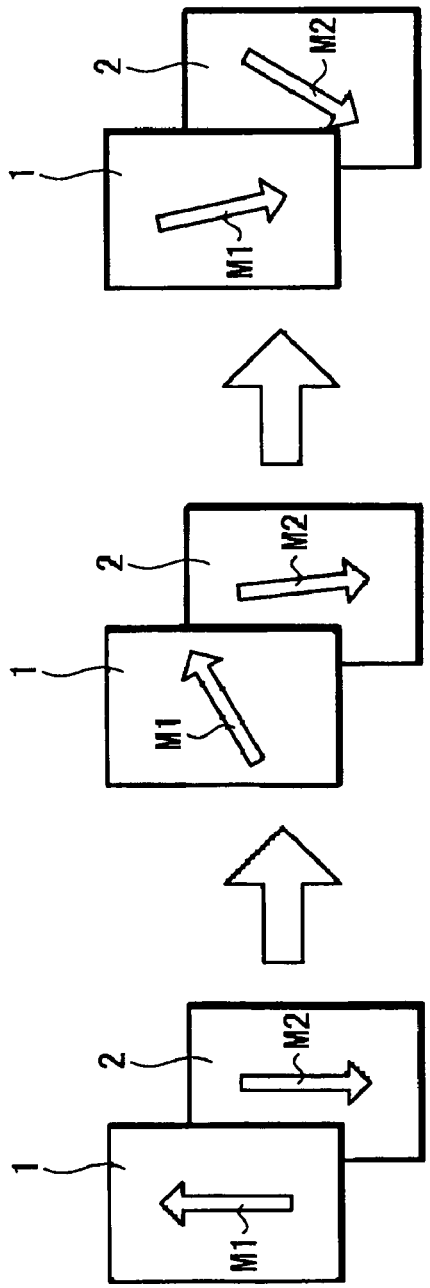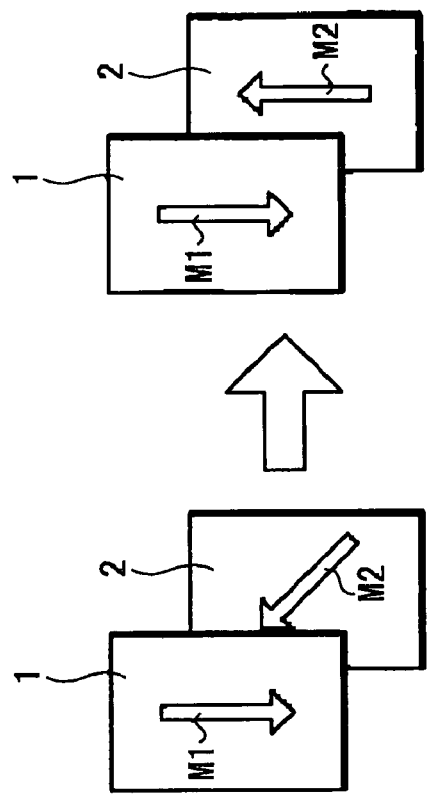

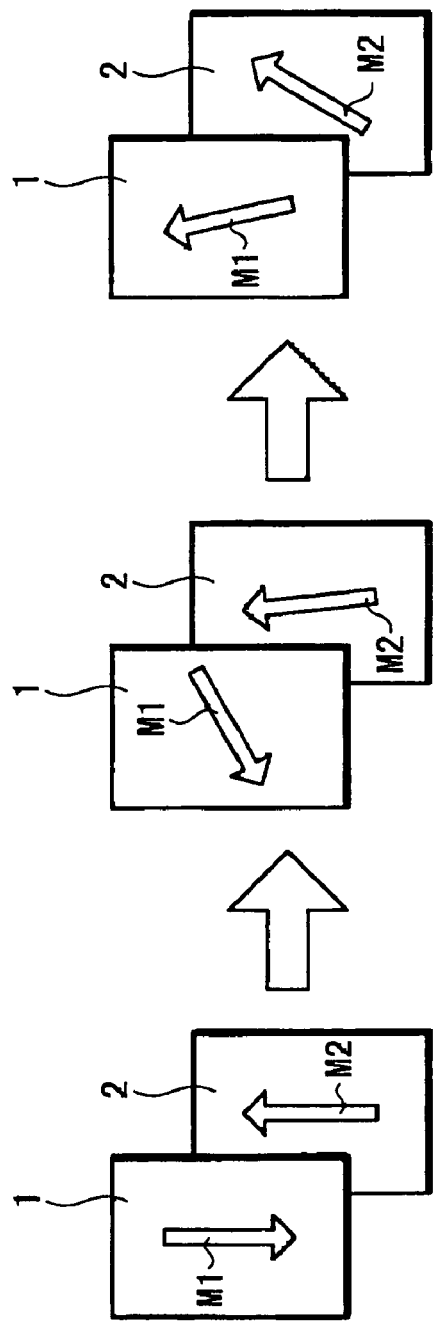
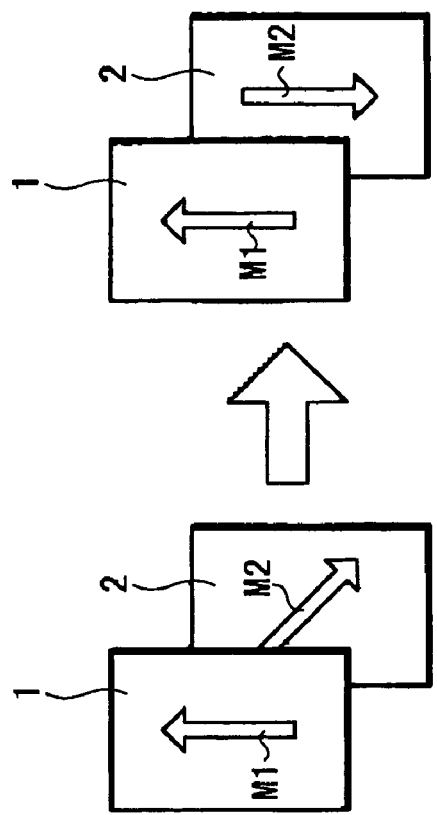
FIG. 5A FIG. 5B FIG. 5C FIG. 5D FIG. 5E

LOW CURRENT MAGNETIC MEMORY

BACKGROUND OF THE INVENTION

1. Field of the Invention

The present invention relates to a magnetic memory device and a magnetic memory device driving method for recording and reading information on and from a magnetic memory device and a magnetic memory including a magnetic memory device.

2. Description of the Related Art

Information devices such as a computer use a high-speed and high-density DRAM (dynamic random-access memory) as a random access memory.

However, the DRAM is a volatile memory which can return information only as long as energizing power is applied and hence a nonvolatile memory whose stored information is undisturbed by removal of operating power has been requested.

A magnetic random access memory (MRAM) capable of recording information based upon magnetization of a magnetic material has received a remarkable attention and it has been developed as nominated nonvolatile memories (see cited non-patent reference 1, for example).

The MRAM is able to record information by inverting magnetization of a magnetic layer of a magnetic memory device located at an intersection point of address wirings with an electric current magnetic field generated from each address wiring when an electric current is applied to two kinds of perpendicular address wirings (word line and bit line).

However, in order to stably hold recorded information, a magnetic layer (memory layer) in which information is recorded needs constant coercive force. On the other hand, an electric current of a certain amount should be applied to the address wirings in order to rewrite recorded information.

Then, as the device comprising the MRAM is microminiaturized increasingly, the thickness of the address wiring also is decreased so that an electric current of a sufficiently large amount cannot be applied to such thin address wirings.

Accordingly, as an arrangement capable of inverting magnetization with application of an electric current of a smaller amount, a magnetic memory having an arrangement using magnetization inversion produced by spin-injection receives a remarkable attention (see cited patent reference 1, for example).

Magnetization inversion produced by spin-injection is a technology in which magnetization is inverted in other magnetic material by injecting electrons spin-polarized through the magnetic material into other magnetic material.

Then, the magnetization inversion produced by spin-injection has an advantage in which magnetization can be inverted with application of an electric current of a small amount even when the device is microminiaturized.

[Cited non-patent reference 1]: NIKKEI ELECTRONICS, 2001, 2, VOL. 12 (pp. 164 to 171)

[Cited patent reference 1]: Official gazette of Japanese laid-open patent application No. 2003-17782

However, in the arrangement in which information is recorded by using magnetization inversion produced by the above-mentioned spin-injection, when ferromagnetic tunnel effect is used to detect magnetization information, since resistance of the device is increased, an insulating layer is broken by a recording voltage, which causes a problem.

Also, in order to freely rewrite information with magnetization inversion produced by the spin-injection, the magnetic memory device should be operated with two polarities by the spin-injection.

However, in order to make magnetizations of the above-described two magnetic materials (magnetic material and other magnetic material become anti-parallel to each other by the spin-injection from a theory standpoint, an electric current of a larger amount is required as compared with the case in which magnetizations of the above-described two magnetic materials are made parallel to each other by the spin-injection.

This becomes a problem that should be solved in order to realize an information memory device in which information can be freely rewritten by an electric current of a small amount.

SUMMARY OF THE INVENTION

In view of the aforesaid aspect, it is an object of the present invention to provide a magnetic memory device capable of recording information with application of a low electric current and a magnetic memory device driving method for recording and reading information on and off a magnetic memory device and a magnetic memory including a magnetic memory device.

According to an aspect of the present invention, there is provided a magnetic memory device comprising at least a memory layer for holding information by the magnetization state of a magnetic material, wherein this memory layer is composed of at least magnetic layers of two layers and a nonmagnetic layer interposed between the two magnetic layers, one magnetic layer of the two magnetic layer has a large product of a magnetization damping constant, a magnetization amount and a magnetic anisotropy and a small product of the magnetization amount and the magnetic anisotropy as compared with those of the other magnetic layer.

According to other aspect of the present invention, there is provided a magnetic memory device driving method for recording information on a memory layer with application of an electric current flowing to a magnetic memory device comprising at least the memory layer for holding information by the magnetization state of magnetic material, wherein the memory layer is composed of at least magnetic layers of two layers and a nonmagnetic layer interposed between the magnetic layers of two layers, one magnetic layer of the magnetic layers of two layers has a large product of a magnetization damping constant, a magnetization amount and a magnetic anisotropy and a small product of the magnetization amount and the magnetic anisotropy as compared with those of the other magnetic layer.

In accordance with a further aspect of the present invention, there is provided a magnetic memory comprising a magnetic memory device including at least a memory layer for holding information by the magnetization state of magnetic material, wherein the memory layer is composed of at least magnetic layers of two layers and a nonmagnetic layer interposed between the magnetic layers of two layers, one magnetic layer of the magnetic layers of two layers has a large product of a magnetization damping constant, a magnetization amount and a magnetic anisotropy and a small product of the magnetization amount and the magnetic anisotropy as compared with those of the other magnetic layer and information is recorded on the memory layer of this magnetic memory device with application of an electric current flowing to the memory layer of the magnetic memory device.

According to the arrangement of the magnetic memory device of the present invention, since the magnetic memory device includes at least the memory layer for holding the magnetization state of the magnetic material, the memory layer is composed of at least the magnetic layers of the two layers and the nonmagnetic layer interposed between the magnetic layers of the two layers, one magnetic layer of the magnetic layers of the two layers has the large product of the magnetization damping constant, the magnetization amount and the magnetic anisotropy and has the small product of the magnetization amount and the magnetic anisotropy as compared with those of the other magnetic layer, one magnetic layer has properties in which the magnetization direction is easy to change by spin injection but the magnetization direction is difficult to change by magnetic force such as magnetically induced super resolution. The other magnetic layer has properties in which the magnetization direction is easy to change by magnetic force such as magneto-static coupling but the magnetization direction is difficult to change by spin-injection.

Accordingly, if spin-injection effect is achieved with application of an electric current to the recording layer, the magnetization direction of the other magnetic layer of which magnetization direction is easy to change with application of the spin-injection effect is changed. Further, when the supply of the electric current is stopped, the magnetization direction of one magnetization layer is changed due to action of magneto-static coupling with the other magnetic layer, whereby the magnetization directions of the magnetization layers of two layers comprising the memory layer can be inverted.

Then, since the other magnetization is easy to change the magnetization direction with application of spin-injection, the magnetization direction can be inverted by a relatively small amount of electric current. Also, since one magnetic layer is able to invert the magnetization direction by the magneto-static coupling with the other magnetic layer without application of an electric current, the magnetization directions of the magnetic layers of two layers comprising the memory layer can be changed with a small amount of electric current and hence it becomes possible to record information.

Further, since the magnetization direction of the magnetization layer of the memory layer can be inverted to any of the two directions with application of an electric current of one polarity, that is, an electric current of the same direction, it becomes possible to simplify an arrangement of a drive circuit for applying an electric current.

Also, the magnetic memory device according to the present invention is composed of a laminated body in which respective layers containing the memory layer are laminated with each other on the same plane pattern and conditions such as film thicknesses of the magnetic layers of two layers comprising the memory layer are made different so that the magnetic memory device has the arrangement which can be microminiaturized relatively easily.

According to the above-mentioned magnetic memory device drive method of the present invention, since information is recorded on the magnetic memory device of the present invention with application of the electric current to the memory layer, the magnetization directions of the magnetic layers of the two layers comprising the memory layer are inverted with a small amount of electric current to record information. Also, since the magnetization direction of the magnetic layer of the memory layer can be inverted to any of the two directions with application of the electric current of the same direction, it becomes possible to simplify the arrangement of the drive circuit for applying an electric current.

According to the above-mentioned arrangement of the magnetic memory of the present invention, since the magnetic memory includes the magnetic memory device of the present invention to record information with application of the electric current to the memory layer, the magnetization directions of the magnetic layers of the two layers comprising the memory layer can be inverted with the small amount of electric current to record information and the magnetization direction of the magnetic layer of the memory layer can be inverted to any of the two directions. Thus, it becomes possible to simplify the arrangement of the drive circuit for applying an electric current.

Further, since the magnetic memory has the arrangement in which the magnetic memory device can be microminiaturized relatively easily as described above, it becomes possible to make the magnetic memory become small in size and to increase a recording capacity by increasing a recording density of the magnetic memory with ease.

Also, in the magnetic memory device and its driving method and the magnetic memory of the present invention, it is possible to make the current-voltage characteristic of the magnetic memory device become asymmetric in the film thickness direction of the memory layer depending upon the direction of electric current.

According to the above-mentioned arrangement, if information is recorded on and read out from the memory layer with application of an electric current to the film thickness direction of the memory layer and the directions of the electric current are inverted when information is recorded on the memory layer or information is read out from the memory layer, then it becomes possible to decrease resistance of the magnetic memory device when information is recorded on the memory layer. At the same time, it becomes possible to increase a readout voltage when information is read out from the memory layer. As a result, when information is recorded on the memory layer, an electric current of a sufficiently amount can be applied, and it is possible to read out information with ease when information is read out from the memory layer.

Further, since the electrode can be shared when information is recorded on and read out from the memory layer, it is possible to further simply the arrangement of the electrode and the arrangement of the drive circuit.

According to above-mentioned present invention, it becomes possible to realize a high-density nonvolatile magnetic memory.

BRIEF DESCRIPTION OF THE DRAWINGS

FIGS. 4A to 4E are schematic diagrams used to explain a process in which magnetization is inverted in the magnetic memory device shown in FIG. 3, respectively;

FIGS. 5A to 5E are schematic diagrams used to explain a process in which magnetization is inverted in the magnetic memory device shown in FIG. 3, respectively;

DESCRIPTION OF THE PREFERRED EMBODIMENTS

Prior to the description of the preferred embodiments of the present invention, let us describe the outline of the present invention.

According to the present invention, a magnetic memory device includes a memory layer having a structure composed of at least magnetic layers of two layers and a nonmagnetic layer interposed between the magnetic layers of two layers to hold the magnetization direction (magnetization state) as information.

Also, the magnetization direction of the magnetic layer comprising the recording layer is inverted by using magnetization inverted by spin-injection to record information on this memory layer.

As a method for inverting magnetization, there has so far been proposed a method for inverting magnetization of a memory layer with application of polarized electrons flowing through a magnetic layer of which magnetization direction is fixed and the memory layer.

Figure 1:
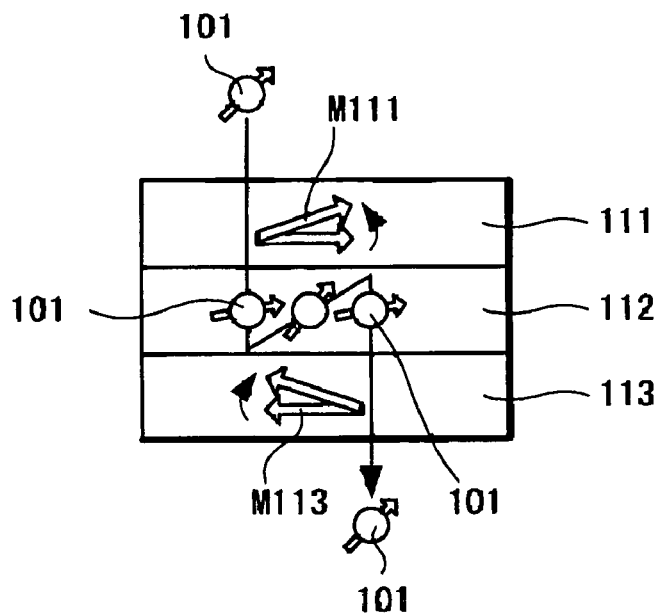
FIG. 1 is a schematic diagram showing the manner in which electrons spin and a magnetization film layer receives force with application of an electric current flowing in the film thickness direction of a magnetic layer.
Figure 2:
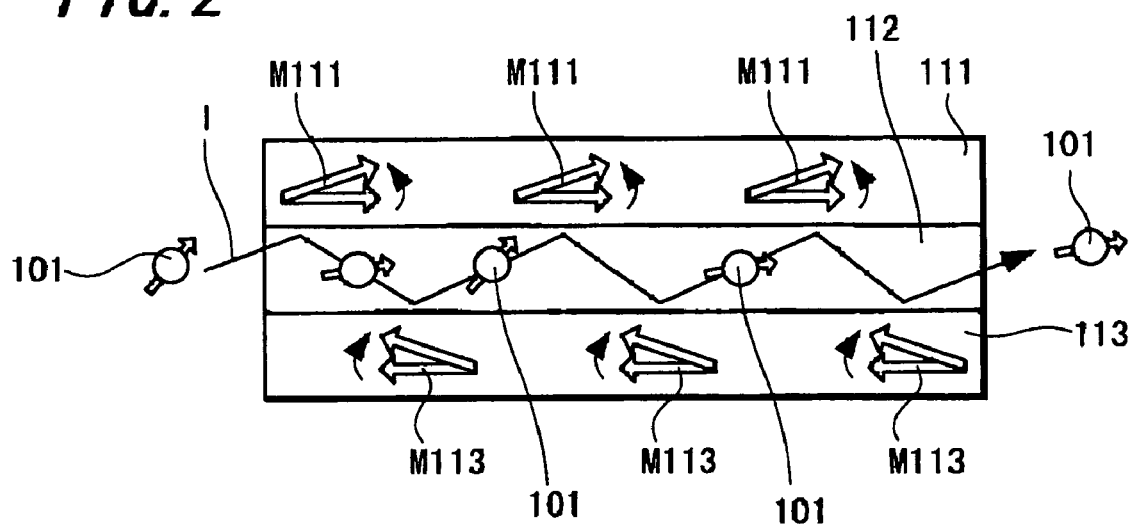
FIG. 2 is a schematic diagram showing the manner in which electrons spin and a magnetization film layer receives force with application of an electric current flowing in the in-plane direction of a magnetic layer.

FIGS. 1 and 2 of the accompanying drawings are diagrams schematically showing a phenomenon in which the magnetization is inverted by spin-injection.

More specifically, FIG. 1 shows the case in which electrons 110 are injected into a structure composed of three layers of a first magnetic layer 111 of an upper layer, a nonmagnetic layer 112 and a second magnetic layer 113 of a lower layer injected and in which case the electrons 101 are injected into the film thickness direction. FIG. 2 shows the case in which the electrons are injected into the direction of the film plane.

First, as shown in FIG. 1, if electrons 101 are injected into the magnetic memory device from the upper layer to the lower layer along the film thickness direction, then when the electrons 101 pass through the first magnetic layer 111 of the upper layer, electron spin is polarized and electrons 101 pass through the nonmagnetic layer 112 and enter into the second magnetic layer 113 of the lower layer. Part of the electrons 101 is reflected and a magnetic moment is exchanged between spin of the electron 101 and the second magnetic layer 113 when the electrons 101 are reflected, and rotation torque acts on magnetization M113 of the second magnetic layer 113 of the lower layer so that the direction of the magnetization M113 of the second magnetic layer 113 is rotated from the direction of the film plane.

Further, the thus reflected electrons 101 are returned to the first magnetic layer 111 of the upper layer and part of the electrons 101 is reflected, whereby a magnetic moment is exchanged between spin of the electron 101 and the first magnetic layer 111. As a result, rotation torque acts also on magnetization M111 of the first magnetic layer 111 of the upper layer so that the direction of the magnetization M111 of the first magnetic layer 111 also is rotated from the direction of the film plane.

If the direction of the magnetization M111 of the first magnetic layer 111 of the upper layer is fixed, then only the magnetization M113 of the second magnetic layer 113 of the lower layer is rotated so that the direction of the magnetization M113 of the second magnetic layer 113 is rotated with application of the electric current to the film thickness direction, thereby resulting in the magnetization M111 of the first magnetic layer 111 and the magnetization M113 of the second magnetic layer 113 being made parallel to each other.

If on the other hand the direction of the magnetization M113 of the magnetization 113 of the lower layer is fixed, then the directions of the magnetizations can be made anti-parallel. However, the directions of the magnetizations are made anti-parallel at poor efficiency, which requires a large amount of an electric current as compared with the case in which the directions of the magnetizations are made parallel to each other.

If the directions of the magnetizations M111, M113 of the first magnetic layer 111 and the third magnetic layer 113 are not fixed, then with application of the electric current to the film thickness direction, force to make the directions of these magnetizations M111, M113 become parallel to each other is increased.

Next, as shown in FIG. 2, when electrons 101 are injected in the in-plane direction, while the thus injected electrons 101 are being scattered on the interface between the nonmagnetic layer 112 and the first magnetic layer 111 of the upper layer and the interface between the nonmagnetic layer 112 and the second magnetic layer 113 of the lower layer, magnetic moment is exchanged between the first magnetic layer 111 of the upper layer and the second magnetic layer 113 of the lower layer.

Consequently, force acts on the magnetic memory device such that the magnetization M111 of the first magnetic layer 111 and the magnetization M113 of the second magnetic layer 113 become parallel to each other.

As described above, when an electric current is applied to the in-plane direction of the magnetic layer, effects achieved when an electric current is applied to the film thickness direction of the magnetic layer can be obtained.

An electric current Ic required to invert magnetization by spin-injection is expressed by the following equation (see J. C. Slonzewski: Journal of Magnetism and Magnetic Materials, Volume 159 (1996) L1).

$$Ic = \alpha \cdot e \cdot \gamma \cdot Ms \cdot V \cdot H_{\mathit{eff}}/(g \cdot \mu_B) \quad (1)$$

where $\alpha$ represents the damping constant, e represents the electric charge of electron, $\gamma$ represents the gyro constant, Ms represents the saturated magnetization of the magnetic layer of which magnetization is rotated, $H_{\mathit{eff}}$ represents the anisotropic magnetic field (Ha) produced by magnetic anisotropy or the effective magnetic field such as an external magnetic field acting on the magnetic layer, V represents the volume of the magnetic layer, g represents the spin injection efficiency and $\mu_B$ represents the Bohr magneton.

From this equation (1), it is to be understood that the electric current Ic inverting magnetization by spin-injection is in proportion to the product of the damping constant $\alpha$ of the magnetic material, the saturated magnetization Ms of the magnetic layer and the effective magnetic field $H_{eff}$ acting on the magnetic layer. Then, since the magnetization amount M of the magnetic layer is proportional to the product of the saturated magnetization Ms and the volume V of the magnetic layer, the magnetization amount M of the magnetic layer is proportional to the saturated magnetization Ms so long as the film thickness and the plane pattern are equal to each other. Also, the effective magnetic field $H_{eff}$ and the anisotropic magnetic field Ha produced by the magnetic anisotropy of the magnetic layer become substantially equal to each other unless there are an external magnetic field and magnetic action between the layers.

Accordingly, it is to be understood that the electric current Ic for inverting the magnetic field by spin-injection is in proportion to the product of the damping constant α, the magnetization amount M of the magnetic layer and the anisotropic magnetic field Ha.

From this proportion relationship, it is to be understood that, if one magnetic layer of the magnetic layers of the two layers comprising the memory layer the nonmagnetic layer sandwiched therebetween is used as the layer having large damping constant α, magnetization amount M and anisotropic magnetic field Ha and an electric current is applied to this magnetic layer, then the magnetization of the magnetic layer with the large damping constant α, magnetization amount M and anisotropic magnetic field Ha is difficult to move and the magnetization of the magnetic layer having small damping constant α, magnetization amount M and anisotropic magnetic field Ha is easy to move.

Also, although magnetic force such as magneto-static coupling is not substantially affected by a difference between the magnitudes of the damping constants α, the magnetization of the magnetization layer having the large magnetization amount M and anisotropic magnetic field Ha is difficult to move and the magnetization of the magnetic layer having the small magnetization amount M and anisotropic magnetic field Ha is easy to move.

Accordingly, if one magnetic layer has the large product of the damping constant α, the magnetization amount M and the anisotropic magnetic field Ha and it has the small product of the magnetization amount M and the anisotropic magnetic field Ha, the magnetization of the magnetic layer is difficult to move by spin-injection but it becomes easy to move by magnetic force such as magneto-static coupling.

Figure 3:
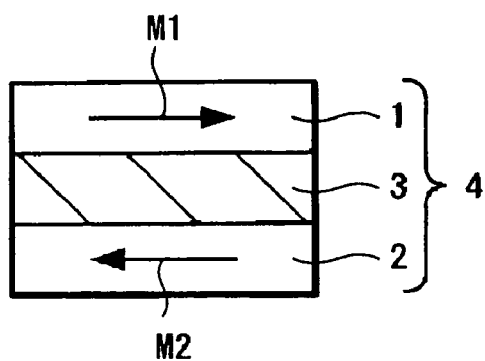
FIG. 3 is a schematic diagram showing a magnetic memory device according to the present invention.

As shown in a schematic cross-sectional view of FIG. 3, a memory layer 4 comprises a first magnetic layer 1 of an upper layer, a second magnetic layer 2 of a lower layer and a non-magnetic layer 3 sandwiched between the first and second magnetic layers 1 and 2. Also, the second magnetic layer 2 of the lower layer has the large product of the damping constant α, the magnetization amount M and the anisotropic magnetic field H as compared with that of the first magnetic layer 1 of the upper layer and it has the small product of the magnetization amount M and the anisotropic magnetic layer H as compared with that of the first magnetic layer of the upper layer. In the stationary state, the direction of the magnetization M1 of the first magnetic layer 1 and the direction of the magnetization M2 of the second magnetic layer 2 become anti-parallel to each other.

Further, the magnetization M1 of the first magnetic layer 1 is easier to move by the spin-injection and the magnetization M2 of the second magnetic layer 2 is easier to move by the magnetic force such as the magneto-static coupling.

FIGS. 4A to 4E are schematic diagrams showing the manner in which the magnetic memory device is operated when an electric current is applied to the memory layer 4 having the above-mentioned arrangement so that magnetization is inverted by spin-injection. In FIGS. 4A to 4E, the two magnetic layers 1, 2 are shown shifted and developed in order to understand the directions of the magnetizations M1, M2 more clearly.

While a magnetic anisotropy acts on the right and left direction in FIG. 3, it acts on the upper and lower direction in FIGS. 4A to 4E.

First, in the initial state, as shown in FIG. 4A, the magnetization M1 of the first magnetic layer 1 acts on the upper direction and the second magnetization M2 of the second magnetic layer 2 acts on the lower direction, which are anti-parallel to each other.

Next, with application of an electric current, as shown in FIG. 4B, the magnetization M1 of the first magnetic layer 1 of the upper layer which is easy to rotate by spin-injection is rotated a large degree and the magnetization M2 of the second magnetic layer 2 of the lower layer is rotated a small degree.

Next, as shown in FIG. 4C, with application of an electric current for a certain time period, the magnetizations stop moving. When a magnetic torque and force such as magnetic anisotropy and reciprocal action are balanced with each other, the magnetizations M1, M2 of the first and second magnetic layers 1, 2 are stabilized with a constant angle kept therebetween. At that time, since a product of an anisotropic magnetic field H and a magnetization amount M of the first magnetic layer 1 is larger than that of the second magnetic layer 2, the magnetization M1 of the first magnetic layer 1 is stabilized at the position close to the anisotropic magnetic field H direction (in the upper and lower direction in FIG. 4C) as compared with the magnetization M2 of the second magnetic layer 2 of the lower layer.

Next, as shown in FIG. 4D, when the application of the electric current is stopped, the state in which the magnetizations M1, M2 of the first and second magnetic layers 1, 2 are anti-parallel to each other is stabilized so that the magnetizations M1, M2 are rotated so as to become anti-parallel to each other. At that time, since the magnetization M2 of the second magnetic layer 2 of the lower layer is easier to rotate by magnetic force than the magnetization M1 of the first magnetic layer 1 of the upper layer, the magnetization M2 of the second magnetic layer 2 of the lower layer is rotated a large degree and thereby the direction of the magnetization M2 is inverted.

Then, finally, as shown in FIG. 4E, the magnetization M1 of the first magnetic layer 1 acts in the lower direction and the magnetization M2 of the second magnetic layer 2 is changed in the upper direction. That is, the magnetizations M1, M2 of the first and second magnetic layers 1, 2 are inverted relative to the initial state.

In this manner, the magnetization inverting operations can be carried out.

Also, as shown in FIGS. 5A to 5E, when the magnetizations M1, M2 of the first and second magnetic layers 1, 2 are inverted in the opposite direction, the magnetization state shown in FIG. 4A can be changed to the magnetization state shown in FIG. 4A. At that time, the direction of applied electric field is the same (spin polarity of electron is the same) and a required electric current amount becomes the same.

As a method for increasing the damping constant α, there may be considered a method in which an alloy film having at least one kind of Ni, Pd, Pt as its principal ingredient is located close to one of magnetic layers of two layers and of which damping constant α should be increased.

Further, according to the present invention, it is suitable that the magnetic memory device may include, in addition to the memory layer 4 having the arrangement shown in FIG. 3, respective layers such as a magnetization fixed layer (reference layer) for detecting the magnetization direction of the memory layer 4, an antiferromagnetic layer for fixing the magnetization of the magnetization fixed layer and a tunnel insulating layer for detecting the magnetization by ferromagnetic tunnel effect.

Subsequently, specific embodiments which can satisfy the above-mentioned arrangement of the present invention will be described.

Figure 6:
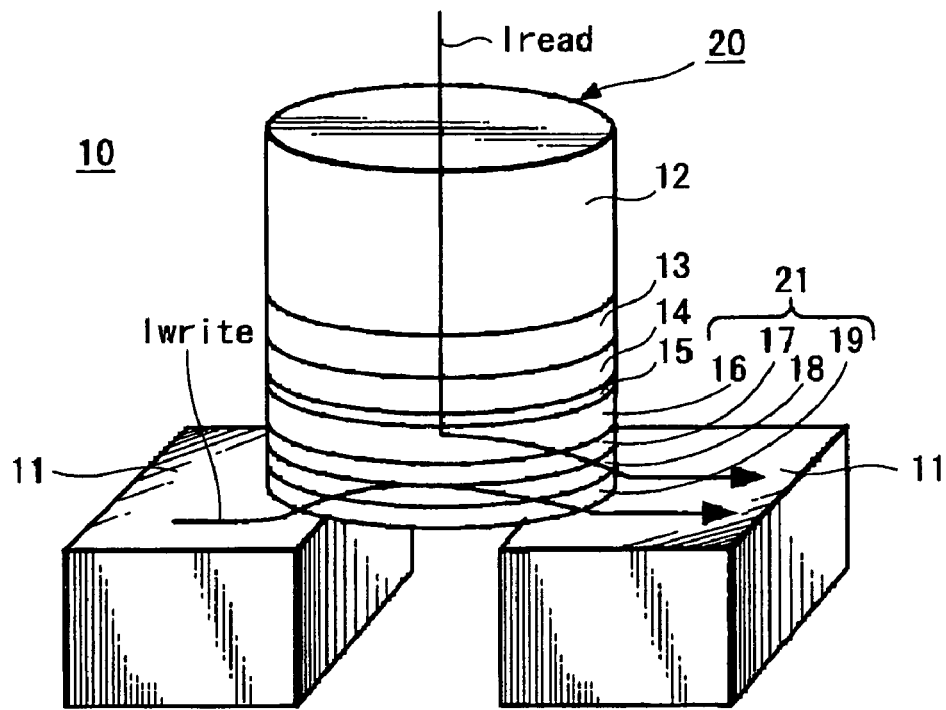
FIG. 6 is a perspective view schematically showing an arrangement of a magnetic memory device according to an embodiment of the present invention.

FIG. 6 is a perspective view showing a schematic arrangement of a magnetic memory device according to an embodiment of the present invention. According to this embodiment, a recording electric current flows in the in-plane direction of a memory layer of a magnetic memory device.

As shown in FIG. 6, this magnetic memory device 10 includes a cylindrical laminated body 20 located across right and left two electrodes 11. The two electrodes 11 are used to apply the recording electric current to the magnetic memory device 10.

Also, the cylindrical laminated body 20 is composed of a readout electrode 12, an antiferromagnetic layer 13, a magnetization fixed layer (reference layer) 14, a tunnel insulating layer 15, a first magnetic layer 16 of a memory layer, a nonmagnetic layer 17, a second magnetic layer 18 of a memory layer and an underlayer 19 laminated, in that order from above.

Then, the nonmagnetic layer 17 is sandwiched between the first magnetic layer 16 of the memory layer and the second magnetic layer 18 of the memory layer, whereby a memory layer 21 having a structure similar to that of the memory layer 4 shown in FIG. 3 is constructed.

According to this embodiment, in particular, the underlayer 19 located at the lower portion of the memory layer of the cylindrical laminated body 20 is constructed so as to have action to increase the damping constant α of the second magnetic layer 18 of the memory layer 21.

For example, an alloy film having at least one kind of Ni, Pd and Pt as its principal ingredient is used as the underlayer 19.

Also, the first magnetic layer 16 and the second magnetic layer 18 of the memory layers are formed of the same magnetic material and are formed on the same plane pattern. The magnetic layers 16 and 18 of these two layers are the same in saturated magnetization and sectional area.

Further, since the film thickness of the second magnetic layer 18 is smaller (thinner) than that of the first magnetic layer 16 and are the same in sectional area, the second magnetic layer 18 has a smaller volume.

That is, since the second magnetic layer 18 has the same saturated magnetization as that of the first magnetic layer 16 and it has a smaller volume than that of the first magnetic layer, the magnetization amount of the second magnetic layer 18 is smaller.

On the other hand, since the second magnetic layer 18 has the damping constant α increased by the underlayer 19, the second magnetic layer 18 has the damping constant α larger than that of the first magnetic layer 16.

Then, the second magnetic layer 18 is formed such that it may have a larger product of the magnetization damping constant α, the magnetization amount and the magnetic anisotropy and a smaller product of the magnetization amount and the magnetic anisotropy than those of the first magnetic layer 16.

For this reason, while the second magnetic layer 18 is easier to change the direction of the magnetization by magnetic force such as magneto-static coupling, it is difficult to change the direction of the magnetization by the spin-injection.

On the other hand, while the first magnetic layer 16 is easier to change the direction of the magnetization by the spin-injection, it is difficult to change the direction of the magnetization by magnetic force such as magneto-static coupling.

Also, according to this embodiment, when information is recorded on the memory layer 21, an electric current is applied to flow through the two electrodes 11 and a recording electric current is applied to the magnetic memory device 10 along the in-plane direction of the memory layer 21.

Since the tunnel insulating layer 15 has a large specific resistance as compared with those of other layers, most of the recording currents flows through the respective layers 16, 17, 18, 19 comprising the recording layer 21 as shown by Iwrite in FIG. 6.

The direction of the magnetization of the first magnetic layer which is easy to change the direction of the magnetization by the spin-injection is changed by this recording current so that the directions of the magnetizations of the two layers 16, 18 shown in FIG. 6 become substantially parallel to each other. Further, when the supply of the recording current is stopped, the direction of the magnetization of the second magnetic layer 18 is changed by the action of the magneto-static coupling and the first directions of the magnetizations of the two layers 16, 18 can be inverted, whereby information can be recorded.

When on the other hand information is read out from the memory layer 21, a resistance value is detected by applying an electric current Iread to the magnetic memory device 10 along the film thickness direction of the memory layer 21, that is, the laminated direction of the laminated body 20.

When the direction of the magnetization of the first magnetic layer 16 of the memory layer 21 and the direction of the magnetization of the magnetization fixed layer (reference layer) 14 are parallel to each other, a resistance value is low. When they are anti-parallel to each other, a resistance value is high. Thus, the direction of the magnetization of the first magnetic layer 16 of the memory layer 21 is identified by detecting the resistance value and thereby contents of information can be detected.

Then, the magnetic memory device 10 according to this embodiment constructs the memory cell, and the magnetic memory such as the MRAM can be constructed by disposing a large number of memory cells in an XY matrix fashion (that is, two-dimensional fashion).

In such magnetic memory, suitable devices such as wirings are connected to the electrodes in order to cause an electric current to flow and to apply a voltage to the magnetic memory device 10. Then, when information is recorded on the magnetic memory device 10 or recorded information is read out from the magnetic memory device 10, an electric current of a voltage is supplied to the magnetic memory device 10 of the memory cell of the object from a driving circuit through the suitable device such as the wiring.

According to the above-mentioned arrangement of the magnetic memory device 10 of this embodiment, since the memory layer 21 is composed of at least the magnetic layers 16, 18 of the two layers and the nonmagnetic layer 17 sandwiched between the magnetic layers 16 and 18 and the underlayer 19 having action to increase the damping constant α, the damping constant α of the second magnetic layer 18 becomes larger than the damping constant α of the first magnetic layer 16. Also, since the second magnetic layer 18 has a film thickness smaller (thinner) than the first magnetic layer 16 and the first and second magnetic layers 16 and 18 are the same in material and plane pattern, the magnetization amount of the second magnetic layer 18 is smaller than that of the first magnetic layer 16.

Then, the second magnetic layer 18 is formed so as to have a larger product of the magnetization damping constant α, the magnetization amount and the magnetic anisotropy and a smaller product of the magnetization amount and the magnetic anisotropy as compared with those of the first magnetic layer 16.

Thus, the first magnetic layer 16 has properties such that the direction of the magnetization is easy to be changed by the magnetic force such as the magneto-static coupling and that the direction of the magnetization is difficult to be changed by the spin-injection. Also, the second magnetic layer 18 has such properties that the direction of the magnetization is easy to be changed by the spin-injection and that the direction of the magnetization is difficult to be changed by the magnetic force such as the magneto-static coupling.

Accordingly, when the electric current flows in the memory layer 21, the direction of the magnetization of the first magnetic layer 16 in which the direction of the magnetization is easy to be changed by the spin-injection can be changed. Further, when the supply of the recording current is stopped, the direction of the magnetization of the second magnetic layer 18 is changed by action of the magneto-static coupling with the first magnetic layer 16 and hence the directions of the magnetizations of the first and second magnetic layers 16, 18 of the two layers can be inverted from the first directions.

Then, when the recording current Iwrite flows through the memory layer 21 having this arrangement along the in-plane direction to record information on the memory layer 21, similarly to FIGS. 4A to 4E and FIGS. 5A to 5E, the directions of the magnetizations of the first and second magnetic layers 16, 18 of the memory layer 21 can be inverted and thereby information can be recorded on the memory layer 21.

At that time, since the first magnetic layer 16 is easy to change the direction of the magnetization by the spin-injection, the direction of the magnetization can be inverted by an electric current of a relatively small amount. Also, the second magnetic layer 18 can invert the direction of the magnetization by the magneto-static coupling with the first magnetic layer 16 in the state in which no electric current flows therein.

As a result, with the recording current Iwrite with a small amount, it becomes possible to record information by inverting the directions of the magnetizations of the two magnetic layers 16, 18 of the memory layer 21.

Further, since the directions of the magnetizations of the magnetic layers 16, 18 of the recording layer 21 can be inverted to any of the two directions by only the recording current Iwrite of one polarity, that is, the same direction similarly to FIGS. 4A to 4E and FIGS. 5A to 5E, it is possible to simplify the arrangement of the drive circuit for causing the recording current Iwrite to flow.

Therefore, it becomes possible to increase the storage capacity by making the magnetic memory in which the memory cells are constructed by the magnetic memory devices 10 become small in size or by increasing the density of the magnetic memory.

Accordingly, if the magnetic memory is constructed so as to include the magnetic memory device 10 according to this embodiment, it becomes possible to realize the high-density magnetic memory with small power consumption.

Figure 7:
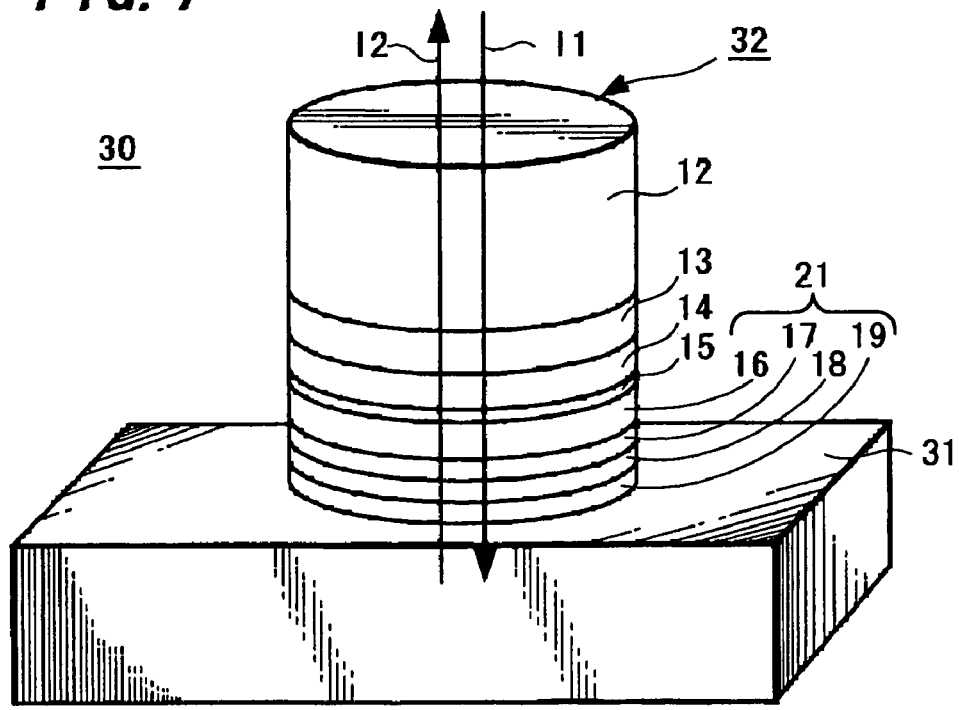
FIG. 7 is a perspective view schematically showing an arrangement of a magnetic memory device according to another embodiment of the present invention.

FIG. 7 is a schematic perspective view showing an arrangement of a magnetic memory device according to another embodiment of the present invention. This embodiment describes the case in which an electric current flows in the film thickness direction of the memory layer of the magnetic memory device.

As shown in FIG. 7, this magnetic memory device 30 includes a cylindrical laminated body 32 formed on an electrode 31.

The cylindrical laminated body 32 in FIG. 7 is composed of respective layers similar to those of the cylindrical laminated body 20 shown in FIG. 6 and therefore the respective layers in FIG. 7 are denoted by identical reference numerals in FIG. 6.

However, the preferred arrangements (film thicknesses and materials) of the respective layers 12 to 19 of the laminated body 32 in FIG. 7 are not always the same as those of the case shown in FIG. 6.

When an electric current flows in the film thickness direction of the memory layer to record information on the magnetic memory device, resistance of the magnetic memory device has to be lowered. However, when the resistance of the magnetic memory device is lowered, a readout voltage is lowered unavoidably and hence it is difficult to make the lowered resistance and the lowered readout voltage become compatible with each other in the same device characteristics.

According to this embodiment, in order to solve this problem, further, the magnetization fixed layer 14 and the magnetic memory layer first magnetic layer 16 provided at both sides of the tunnel insulating layer 15 are made of materials with different Fermi levels, respectively, and resistances relative to the electric current flowing in the film thickness direction of these layers 14, 16 are made asymmetric.

That is, the magnetic memory device 30 may be given pseudo-diode characteristics.

According to this arrangement, if an electric current flows in the low resistance side to record information and an electric current flows in the high resistance side to read out recorded information, then resistance of the magnetic memory device can be decreased upon recording and the readout voltage can be increased.

For example, if the resistance of the first magnetic layer 16 is decreased to be lower than that of the magnetization fixed layer 14, when information is recorded on the magnetic memory device 30, a downward electric current I1 shown in FIG. 7 may flow through the magnetic memory device 30. When information is read out from the magnetic memory device 30, an upward electric current I2 shown in FIG. 7 may flow through the magnetic memory device 30.

According to the arrangement of the magnetic memory device 30 of this embodiment, since the memory layer 21 has the arrangement similar to that of the magnetic memory device 10 of the preceding embodiment, similarly to the preceding embodiment, it becomes possible to record information by inverting the directions of the magnetizations of the magnetic layers 16, 18 of the two layers comprising the memory layer with a recording electric current of a small amount.

Then, since the directions of the magnetizations of the magnetic layers 16, 18 comprising the memory layer 21 can be inverted to any of the two directions only with a recording electric current of one polarity, it is possible to simplify the arrangement of the drive circuit for driving the magnetic memory device 30.

Also, the magnetic memory device 30 can be microminiaturized relatively easily.

Accordingly, if the magnetic memory includes the magnetic memory device 30 according to this embodiment, then it becomes possible to realize a high-density magnetic memory with small power consumption.

Also, according to the arrangement of the magnetic memory device 30 of this embodiment, since the magnetization fixed layer 14 and the memory layer first magnetic layer 16 located at both sides of the tunnel insulating layer 15 are respectively made of the materials with different Fermi levels so that the resistances relative to the electric current in the film thickness direction of these layers 14, 16 may become asymmetric, when an electric current flows in the low resistance side to record information on the magnetic memory device 30 and an electric current flows in the high resistance side to read out information from the magnetic memory device 30, the resistance of the magnetic memory device 30 can be decreased upon recording and at the same time, the readout voltage can be increased.

In consequence, the magnetic memory has the arrangement in which the recording electric current flows in the film thickness direction (direction in which the respective layers of the laminated body 32 are laminated) of the respective layers of the magnetic memory device 30 and the current amount of the recording current can be decreased. In this case, since the recording current flows in the film thickness direction of the respective layers of the magnetic memory device 30, the readout current and the electrode can be shared. Thus, as compared with the case in which the recording current flows in the in-plane direction of the recording layer, it is possible to simplify the arrangement of the electrode and the arrangement of the drive circuit for driving the magnetic memory device 30 much more.

INVENTIVE EXAMPLE

In the arrangement of the magnetic memory device according to the present invention, dimensions of the memory layer, magnetization amounts and the like were set specifically and characteristics were examined.

Figure 8:
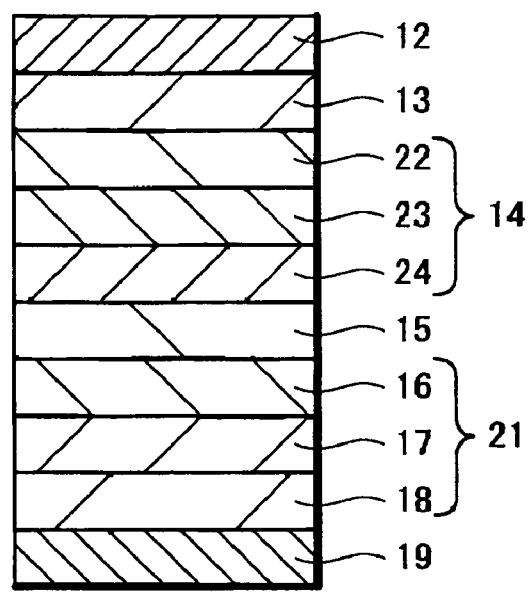
FIG. 8 is a schematic cross-sectional view showing a film arrangement of the magnetic memory device according to the embodiment of the present invention.

FIG. 8 is a schematic cross-sectional view showing a magnetic memory device according to the inventive example of the present invention.

First, as the arrangement of the inventive example of the magnetic memory device according to the present invention, the arrangements of the respective layers of the laminated body were selected to be similar to those of the embodiments shown in FIGS. 6 and 7 and a magnetic memory device 40 composed of a laminated body was constructed as shown in FIG. 8. In the case of FIG. 8, the magnetization fixed layer 14 shown in FIGS. 6 and 7 is formed as a laminated ferri structure in which a magnetic layer 22, a nonmagnetic layer 23 and a magnetic layer 24 are laminated with each other. In this case, the magnetic layer 24 of the lower layer of the magnetization fixed layer 14 serves as the reference layer.

Then, materials and film thicknesses of the respective layers were set as follows and the magnetic memory device 40 was constructed.

Specifically, the magnetic memory device 40 had an underlayer (having action to increase a damping constant of a second magnetic layer 18 of recording layer 21) composed of an NiCr film having a film thickness of 10 nm on which there were laminated a second magnetic layer (low magnetic anisotropy) of a memory layer composed of an NiFe film having a film thickness of 3 nm, a nonmagnetic layer 17 composed of a Cu film having a film thickness of 5 nm, a first magnetic layer (high magnetic anisotropy) 16 of a memory layer composed of a CoBiCr film having a film thickness of 5 nm, a tunnel insulating layer 15 composed of an Al—O (aluminum oxide) film having a film thickness of 1 nm, a magnetic layer (reference layer) 24 composed of a CoFe film having a film thickness of 2 nm, a nonmagnetic layer (interaction mediate layer) 23 composed of a Ru film having a film thickness of 0.8 nm, a magnetic layer 22 composed of a CoFe film having a film thickness of 2 nn, an antiferromagnetic layer 13 composed of a PtMn film having a film thickness of 30 nm and an electrode layer 12 composed of a Ti film having a film thickness of 20 nm, in that order.

The NiFe film of the second magnetic layer 18 of the memory layer 21 has low magnetic anisotropy, and the CoNiCr film of the first magnetic layer 16 has high magnetic anisotropy.

Also, the film thicknesses of the first magnetic layer 16 and the second magnetic layer 18 are set in such a manner that the magnetization amounts $M_s$ thereof may become substantially equal to each other. Then, since the damping constant $\alpha$ of the second magnetic layer 18 is increased by action of the underlayer 19 provided beneath the second magnetic layer 18, the second magnetic layer 18 has the larger product of the damping constant $\alpha$, the magnetization amount $M_s$ and the magnetic anisotropy $H_{\mathit{eff}}$ and the first magnetic layer 16 has the smaller product of the magnetization amount $M_s$ and the magnetic anisotropy $H_{\mathit{eff}}$.

Further, although not shown, the plane shape of the magnetic memory device 40 is shaped like a circle having a diameter of about 200 nm so that two recording electrodes (similar to the electrode 11 in FIG. 6) with a spacing of 150 nm and the magnetic memory device 40 may be conducted with each other.

In the magnetic memory device 40 having this arrangement, after a pulse electric current of 100 nanoseconds have flowed through the two recording electrodes as the recording current, resistance (readout resistance) between the upper and lower electrodes of the magnetic memory device 40 was measured. Then, while the electric current value of the pulse electric current was increased progressively, resistance was measured repeatedly, and a degree in which the resistance (readout resistance) was changed relative to the electric current value of the pulse electric current was measured.

Figure 9:
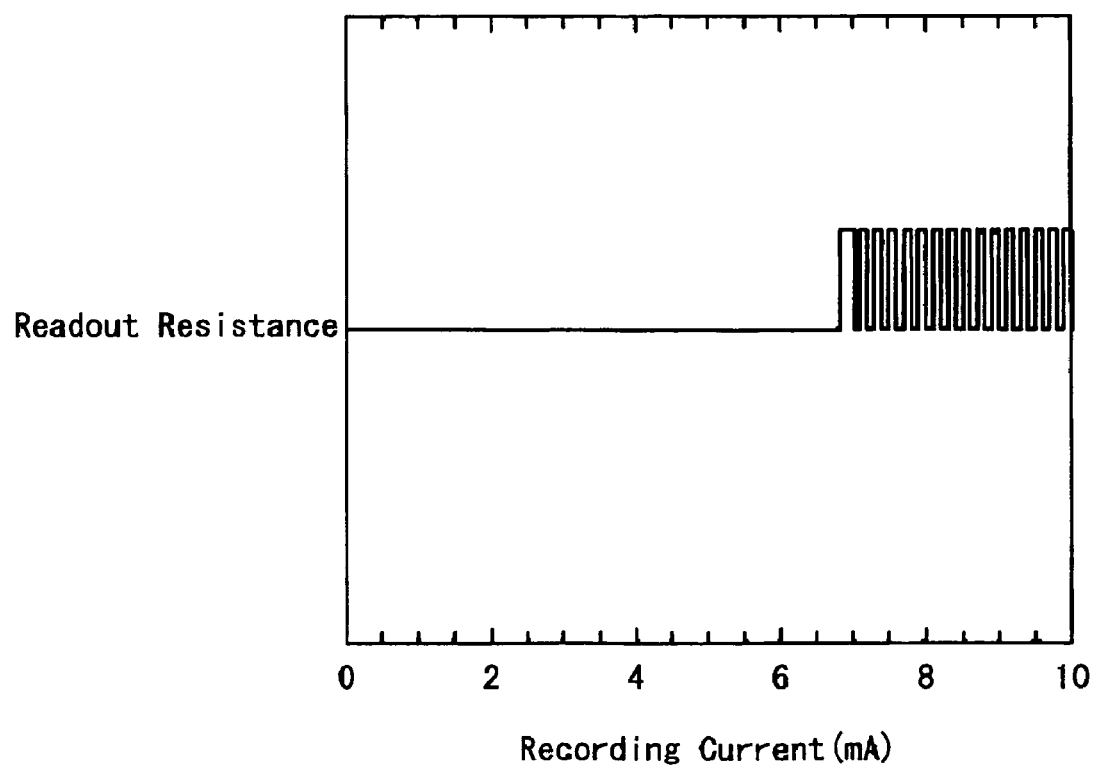
FIG. 9 is a diagram showing the manner in which resistance is changed relative to a recording electric current flowing through the magnetic memory device shown in FIG. 8.

FIG. 9 shows measured results.

A study of FIG. 9 reveals that, when the recording current is increased in excess of a certain value, the directions of the magnetizations of the magnetic layers 16, 18 of the memory layer 21 are inverted by the pulse recording electric current so that vibrations are observed from the resistance (readout resistance).

Accordingly, it is possible to record information by repeatedly inverting the directions of the magnetizations of the magnetic layers 16, 18 of the memory layer 21 and it is to be understood that this magnetic memory device 40 according to the inventive example is suitable for use as the application to the memory device.

From FIG. 9, it is also to be understood that information can be recorded on the magnetic memory device 40 by a relatively low recording electric current amount of approximately 7 mA.

Comparative Example

On the other hand, properties of a magnetic memory (magnetic memory device) in which a recording layer is composed of only one magnetic layer of only one layer were measured in comparison with and in contrast with the inventive example.

Figure 10:
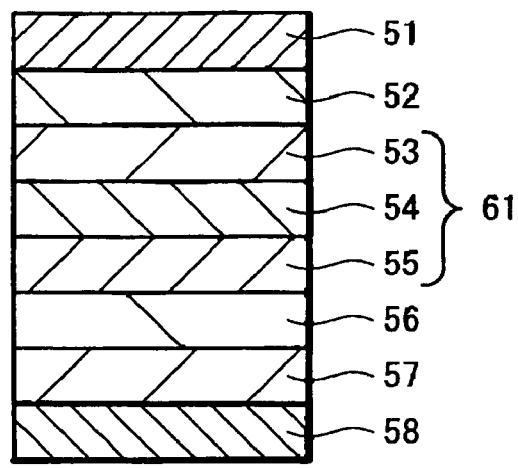
FIG. 10 is a schematic diagram showing a film arrangement of a magnetic memory device used as a comparative example.

FIG. 10 is a schematic cross-sectional view showing an arrangement of a magnetic memory device 50 according to the comparative example. Respective layers of the magnetic memory device 50 were constructed as shown in FIG. 10.

A laminated body comprising the magnetic memory device 50 is composed of an electrode layer 51 serving also as a protecting layer, an antiferromagnetic layer 52, a magnetic layer 53, a nonmagnetic layer 54, a magnetic layer 55, a tunnel insulating layer 56, a memory layer 57 and an underlayer 57 laminated in that order from above. Also, the magnetic layer 53, the nonmagnetic layer 54 and the magnetic layer 55 constitute a magnetization fixed layer 61 having a laminated ferri structure. In this case, the magnetic layer 55 of the lower layer of the magnetization fixed layer 61 serves as a reference layer.

That is, in this magnetic memory device 50, the memory layer is constructed by the magnetic layer 57 of one layer.

Then, materials and film thicknesses of respective materials were set as follows and the magnetic memory device 50 was manufactured.

Specifically, this magnetic memory device 50 had an underlayer 58 formed of a Ta film having a film thickness of 10 nm on which there were laminated the memory layer 57 formed of an NiFe film having a film thickness of 3 nm, the tunnel insulating layer 56 formed of an Al—O (aluminum oxide) film having a film thickness of 1 nm, the magnetic layer (reference layer) 55 formed of a CoFe film having a film thickness of 2 nm, the nonmagnetic layer 54 formed of a Ru film having a film thickness of 0.8 nm, the magnetic layer 53 formed of a CoFe film having a film thickness of 2 nm, the antiferromagnetic layer 52 formed of a PtMn film having a film thickness of 30 nm and the electrode layer 51 formed of a Ti film having a film thickness of 20 nm, in that order.

Although not shown, the flat surface shape of the magnetic memory device 50 is a circle with a diameter of about 200 nm.

After a pulse electric current with a width of 100 nanoseconds was applied to the magnetic memory device 50 having the above-mentioned arrangement along the film thickness direction (upper and lower direction in FIG. 10) of the magnetic memory device 50 similarly to the magnetic memory device 40 according to the preceding inventive example, resistance (readout resistance) between the upper and lower electrodes of the magnetic memory device 50 was measured. Then, while the electric current value of the pulse electric current was being increased progressively, the above resistance was measured repeatedly and a degree in which the resistance (readout resistance) was changed relative to the electric current value of the pulse electric current was examined.

Figure 11:
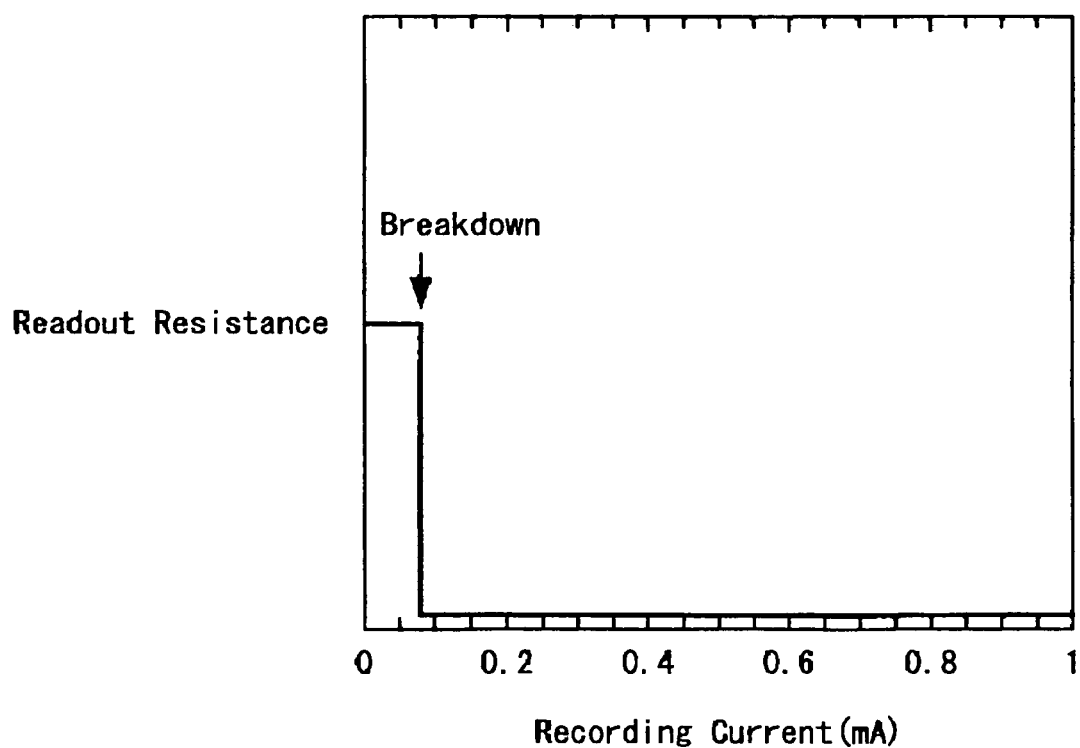
FIG. 11 is a diagram showing the manner in which read resistance is changed relative to a recording electric current flowing through the magnetic memory device shown in FIG. 10.

Measured results are shown in FIG. 11.

From FIG. 11, it is to be understood that the tunnel insulating layer is broken due to breakdown at a low electric current value of approximately 0.075 mA and that the readout resistance is lowered rapidly.

Accordingly, it is to be understood that the magnetic memory device 50 shown in FIG. 10 cannot be used as the memory device without difficulty.

While the magnetic memory device has the magnetic tunnel junction device (MTJ) in which the magnetization fixed layer (reference layer) 14 of which magnetization direction is fixed is laminated on the memory layer 21 through the tunnel insulating layer 15 in the above-mentioned respective embodiments, it is needless to say that the present invention can be applied to other arrangements.

The arrangement for detecting (reading) the magnetized state of the memory layer of the magnetic memory device is not limited to the magnetization fixed layer and it can a giant magnetoresistive effect device (GMR device), a Hall element and the like.

While the underlayer 18 is located just beneath the second magnetic layer 18 of the memory layer 21 in the above-mentioned respective embodiments, according to the present invention, the layer for increasing the damping constant α may be located close to the magnetic layer of the memory layer and hence the present invention is not limited to the arrangement in which the underlayer 19 is located just beneath the second magnetic layer 18 of the memory layer 21. For example, the underlayer 19 may be located under the second magnetic layer 18 of the memory layer 21 through other layer.

Further, the laminated order of the laminated body comprising the magnetic memory device may become opposite to that of the above-mentioned respective embodiments, that is, the magnetization fixed layer side may be used as the lower layer side. In this case, the layer for increasing the damping constant α of one of the two magnetic layer comprising the memory layer may be located above one magnetic layer.

Furthermore, according to the present invention, the arrangement in which the products of the magnetization amounts and the anisotropic magnetic fields of the magnetic layers of two layers become different is not limited to the arrangement of the above-mentioned respective embodiments in which film thicknesses are made different and other arrangements also are possible.

For example, even an arrangement in which saturation magnetic fields are made different by different magnetic materials in use and by different compositions of magnetic materials or an arrangement in which volumes are made different by different plane patterns may have different magnetization amounts or it may have different anisotropic magnetic fields.

According to the present invention, there is provided a magnetic memory device comprising at least a memory layer for holding information by the magnetization state of magnetic material, wherein this memory layer is composed of at least magnetic layers of two layers and a nonmagnetic layer interposed between the two magnetic layers, one magnetic layer of the two magnetic layer has a large product of a magnetization damping constant, a magnetization amount and a magnetic anisotropy and a small product of the magnetization amount and the magnetic anisotropy as compared with those of the other magnetic layer.

Further, according to the present invention, there is provided a magnetic memory device driving method for recording information on a memory layer with application of an electric current flowing to a magnetic memory device comprising at least the memory layer for holding information by the magnetization state of magnetic material, wherein the memory layer is composed of at least magnetic layers of two layers and a nonmagnetic layer interposed between the magnetic layers of two layers, one magnetic layer of the magnetic layers of two layers has a large product of a magnetization damping constant, a magnetization amount and a magnetic anisotropy and a small product of the magnetization amount and the magnetic anisotropy as compared with those of the other magnetic layer.

Furthermore, there is provided a magnetic memory comprising a magnetic memory device including at least a memory layer for holding information by the magnetization state of magnetic material, wherein the memory layer is composed of at least magnetic layers of two layers and a nonmagnetic layer interposed between the magnetic layers of two layers, one magnetic layer of the magnetic layers of two layers has a large product of a magnetization damping constant, a magnetization amount and a magnetic anisotropy and a small product of the magnetization amount and the magnetic anisotropy as compared with those of the other magnetic layer and information is recorded on the memory layer of this magnetic memory device with application of an electric current flowing to the memory layer of the magnetic memory device.

According to the arrangement of the magnetic memory device of the present invention, since the magnetic memory device includes at least the memory layer for holding the magnetization state of the magnetic material, the memory layer is composed of at least the magnetic layers of the two layers and the nonmagnetic layer interposed between the magnetic layers of the two layers, one magnetic layer of the magnetic layers of the two layers has the large product of the magnetization damping constant, the magnetization amount and the magnetic anisotropy and has the small product of the magnetization amount and the magnetic anisotropy as compared with those of the other magnetic layer, one magnetic layer has properties in which the magnetization direction is easy to change by spin-injection but the magnetization direction is difficult to change by magnetic force such as magnetically induced super resolution. The other magnetic layer has properties in which the magnetization direction is easy to change by magnetic force such as magneto-static coupling but the magnetization direction is difficult to change by spin-injection.

Accordingly, if spin-injection effect is achieved with application of an electric current to the recording layer, the magnetization direction of the other magnetic layer of which magnetization direction is easy to change with application of the spin injection effect is changed. Further, when the supply of the electric current is stopped, the magnetization direction of one magnetization layer is changed due to action of magneto-static coupling with the other magnetic layer, whereby the magnetization directions of the magnetization layers of two layers comprising the memory layer can be inverted.

Then, since the other magnetization is easy to change the magnetization direction with application of spin-injection, the magnetization direction can be inverted by a relatively small amount of electric current. Also, since one magnetic layer is able to invert the magnetization direction by the magneto-static coupling with the other magnetic layer without application of an electric current, the magnetization directions of the magnetic layers of two layers comprising the memory layer can be changed with a small amount of electric current and hence it becomes possible to record information.

Further, since the magnetization direction of the magnetization layer of the memory layer can be inverted to any of the two directions with application of an electric current of one polarity, that is, an electric current of the same direction, it becomes possible to simplify an arrangement of a drive circuit for applying an electric current.

Also, the magnetic memory device according to the present invention is composed of a laminated body in which respective layers containing the memory layer are laminated with each other on the same plane pattern and conditions such as film thicknesses of the magnetic layers of two layers comprising the memory layer are made different so that the magnetic memory device has the arrangement which can be microminiaturized relatively easily.

According to the above-mentioned magnetic memory device drive method of the present invention, since information is recorded on the magnetic memory device of the present invention with application of the electric current to the memory layer, the magnetization directions of the magnetic layers of the two layers comprising the memory layer are inverted with a small amount of electric current to record information. Also, since the magnetization direction of the magnetic layer of the memory layer can be inverted to any of the two directions with application of the electric current of the same direction, it becomes possible to simplify the arrangement of the drive circuit for applying an electric current.

According to the above-mentioned arrangement of the magnetic memory of the present invention, since the magnetic memory includes the magnetic memory device of the present invention to record information with application of the electric current to the memory layer, the magnetization directions of the magnetic layers of the two layers comprising the memory layer can be inverted with the small amount of electric current to record information and the magnetization direction of the magnetic layer of the memory layer can be inverted to any of the two directions. Thus, it becomes possible to simplify the arrangement of the drive circuit for applying an electric current.

Further, since the magnetic memory has the arrangement in which the magnetic memory device can be microminiaturized relatively easily as described above, it becomes possible to make the magnetic memory become small in size and to increase a recording capacity by increasing a recording density of the magnetic memory with ease.

Also, in the magnetic memory device and its driving method and the magnetic memory of the present invention, it is possible to make the current-voltage characteristic of the magnetic memory device become asymmetric in the film thickness direction of the memory layer depending upon the direction of electric current.

According to the above-mentioned arrangement, if information is recorded on and read out from the memory layer with application of an electric current to the film thickness direction of the memory layer and the directions of the electric current are inverted when information is recorded on the memory layer or information is read out from the memory layer, then it becomes possible to decrease resistance of the magnetic memory device when information is recorded on the memory layer. At the same time, it becomes possible to increase a readout voltage when information is read out from the memory layer. As a result, when information is recorded on the memory layer, an electric current of a sufficiently amount can be applied, and it is possible to read out information with ease when information is read out from the memory layer.

Further, since the electrode can be shared when information is recorded on and read out from the memory layer, it is possible to further simply the arrangement of the electrode and the arrangement of the drive circuit.

According to above-mentioned present invention, it becomes possible to realize a high-density nonvolatile magnetic memory.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A magnetic memory device comprising:
   at least one memory layer for holding information by a magnetization state of a magnetic material;
   first and second electrodes coupled to said at least one memory layer and configured to pass an electric current of a single polarity from the first electrode to the second electrode and through the at least one memory layer to change the magnetization state of the magnetic material both to a first state and to a second state; and
   a drive circuit to apply the electric current of the single polarity to the first electrode, the electric current being of the single polarity regardless of a desired magnetization state of the magnetic material;
   wherein said at least one memory layer is comprised of at least two magnetic layers and a nonmagnetic layer interposed between said two magnetic layers and wherein one magnetic layer of said two layers of magnetic layers has a large product of a damping constant of magnetization and a magnetization amount and magnetic anisotropy and has a small product of a magnetization amount and magnetic anisotropy as compared with those of the other magnetic layer.

2. A magnetic memory device according to claim 1, wherein said one magnetic layer is located close to an alloy film comprising a principal ingredient that is at least one of Ni, Pd and Pt.

3. A magnetic memory device according to claim 1, wherein said at least one memory layer has a magnetization fixed layer disposed thereon through a tunnel insulating layer.

4. A magnetic memory device according to claim 1, wherein a current-to-voltage characteristic of a magnetic memory device is asymmetric in a film thickness direction of said at least one memory layer depending upon a direction of an electric current.

5. A magnetic memory device according to claim 3, wherein said magnetic layer of said at least one memory layer which adjoins said tunnel insulating layer and said magnetic layer adjoining said tunnel insulating layer of said magnetization fixed layer are made of magnetic materials of which Fermi levels are different from each other.

6. A magnetic memory comprising:
a magnetic memory device comprising at least one memory layer for holding information by a magnetization state of a magnetic material; and
first and second electrodes coupled to said at least one memory layer and configured to pass an electric current through the at least one memory layer to record information therein,
wherein:
said memory layer is composed of first and second magnetic layers and a nonmagnetic layer interposed between said two magnetic layers, and
the first magnetic layer having a volume larger than a volume of the second magnetic layer such that the first magnetic layer has a large product of a damping constant of magnetization, a magnetization amount and magnetic anisotropy and a small product of said magnetization amount and said magnetic anisotropy as compared with those of the second magnetic layer.

7. A magnetic memory according to claim 6, wherein information is recorded on said magnetic memory with an application of an electric current flowing in an in-plane direction of said at least one memory layer and information is read out from said magnetic memory with an application of an electric current flowing in a film thickness direction of said at least one memory layer.

8. A magnetic memory according to claim 6, wherein:
said magnetic memory device has an asymmetric current-to-voltage characteristic in a film thickness of said at least one memory layer depending upon direction of an electric current,
information is recorded on and read out from said memory layer with an application of an electric current flowing in the film thickness direction of said at least one memory layer, and
electric currents with opposite polarities flow through said magnetic memory device when information is recorded on and read out from said at least one memory layer.

9. A magnetic memory according to claim 8, wherein said magnetic memory device comprises:
a magnetization fixed layer located on said at least one memory layer through a tunnel insulating layer,
a magnetic layer of said at least one memory layer which adjoins said tunnel insulating layer, and
a magnetic layer of said magnetization fixed layer which adjoins said tunnel insulating layer,
and wherein said magnetization fixed layer, said magnetic layer of said at least one memory layer, and said magnetic layer of said magnetization fixed layer are made of magnetic materials of which Fermi levels are different from each other.

10. The magnetic memory of claim 6, wherein the first volume of the first magnetic memory is approximately 157079 cubic nanometers.

* * * * *